United States Patent
Patil et al.

(10) Patent No.: US 11,076,504 B2
(45) Date of Patent: Jul. 27, 2021

(54) ARRANGEMENT FOR DISSIPATING HEAT OF A POWER SUPPLY UNIT IN A HOUSING

(71) Applicant: Appleton Grp LLC, Rosemont, IL (US)

(72) Inventors: Santosh K. Patil, Pune (IN); Timothy E. Graff, Arlington Heights, IL (US)

(73) Assignee: Appleton Grp LLC, Rosemont, IL (US)

( * ) Notice: Subject to any disclaimer, the term of this patent is extended or adjusted under 35 U.S.C. 154(b) by 0 days.

(21) Appl. No.: 16/811,646

(22) Filed: Mar. 6, 2020

(65) Prior Publication Data
US 2020/0288603 A1 Sep. 10, 2020

(30) Foreign Application Priority Data
Mar. 8, 2019 (IN) .............................. 201921009159

(51) Int. Cl.
*H05K 7/20* (2006.01)
*F21V 23/00* (2015.01)
*H01M 10/6551* (2014.01)

(52) U.S. Cl.
CPC ....... *H05K 7/20418* (2013.01); *F21V 23/009* (2013.01); *H01M 10/6551* (2015.04)

(58) Field of Classification Search
None
See application file for complete search history.

(56) References Cited

U.S. PATENT DOCUMENTS

| | | | | |
|---|---|---|---|---|
| 5,469,331 A | * | 11/1995 | Conway | H05K 7/20254 165/80.3 |
| 5,642,260 A | * | 6/1997 | Sigi | B23K 9/32 174/16.1 |
| 5,731,954 A | * | 3/1998 | Cheon | F25B 21/02 165/104.33 |
| 6,234,240 B1 | * | 5/2001 | Cheon | F28D 15/00 165/185 |
| 6,888,099 B1 | * | 5/2005 | Schneider | H05K 7/20918 219/130.1 |
| 7,295,436 B2 | * | 11/2007 | Cheon | G06F 1/20 165/104.33 |

(Continued)

FOREIGN PATENT DOCUMENTS

| | | |
|---|---|---|
| EP | 2667141 A2 | 11/2013 |
| WO | 2017137777 A2 | 8/2017 |

OTHER PUBLICATIONS

First Examination Report under sections 12 & 13 of the Patents Act, 1970 and the Patents Rules, 2003, Indian Application No. 201921009159, dated Nov. 24, 2020, 6 pages.

*Primary Examiner* — Courtney L Smith
(74) *Attorney, Agent, or Firm* — McDonnell Boehnen Hulbert & Berghoff LLP

(57) ABSTRACT

The present disclosure envisages an arrangement (100) for dissipating heat of a power supply unit (105) in a housing (110). The arrangement (100) comprises at least one packing member (120). The packing member (120) is disposed between the power supply unit (105) and an operative inner wall of the housing (110) to increase conductive thermal contact between inner walls of the housing (110) and the power supply unit (105). The arrangement (100) facilitates maximum surface contact between a power supply unit and inner walls of a housing.

12 Claims, 4 Drawing Sheets

(56) References Cited

U.S. PATENT DOCUMENTS

| | | | |
|---|---|---|---|
| 7,651,245 B2 | 1/2010 | Thomas et al. | |
| 7,800,901 B2 * | 9/2010 | Borowy | B23K 9/10 |
| | | | 361/690 |
| 9,185,822 B2 * | 11/2015 | Shanbhogue | H05K 1/144 |
| 10,455,722 B1 * | 10/2019 | Wildstone | G06F 1/26 |
| 2006/0227504 A1 * | 10/2006 | Chen | H05K 7/20927 |
| | | | 361/679.47 |
| 2017/0055358 A1 * | 2/2017 | Aarskog | H02B 1/565 |

* cited by examiner

ARRANGEMENT FOR DISSIPATING HEAT OF A POWER SUPPLY UNIT IN A HOUSING

RELATED APPLICATIONS

This application claims priority to Indian Application No. 201921009159 entitled "An Arrangement for Dissipating Heat of a Power Supply Unit in a Housing" filed on Mar. 8, 2019, which is herein incorporated by reference in its entirety.

FIELD

The present disclosure relates to the field of arrangements for dissipating heat of a power supply unit mounted in a housing.

BACKGROUND

The background information herein below relates to the present disclosure but is not necessarily prior art.

Conventionally, a power supply unit is fitted in a housing, for example, a housing of an LED fixture for powering the LED, using a plurality of screws that pass through a hole configured on a flange of the power supply unit and a hole configured within the housing. However, in the conventional arrangement, the power supply unit abuts to only one inner wall of the housing. Further, this inner wall of the housing may not have a perfectly planar surface which further reduces the points of surface contact. Due to variation in power rating or manufacturer, the power supply unit comes in various shape and sizes, for example, slim power supply units and rectangular power supply units. This results in reduction in points of surface contact between the walls of the housing and the power supply unit. Reduction in points of surface contact reduces heat transfer between the inner walls of the housing and the power supply unit. To achieve maximum heat dissipation, there must be maximum points of surface contact between the power supply unit and inner walls of the housing as the rate of heat dissipation via conduction is directly proportional to the points of surface in contact. The inefficient heat transfer between the power supply unit and the housing results in increase in temperature of the power supply unit, and thereby, reducing the life of the power supply unit.

Therefore, there is felt a need of an arrangement that alleviates the abovementioned drawbacks of conventional arrangements and facilitates maximum heat transfer between the power supply unit and the housing.

OBJECTS

Some of the objects of the present disclosure, which at least one embodiment herein satisfies, are as follows:

An object of the present disclosure is to provide an arrangement that maximizes surface contact between a power supply unit and inner walls of a housing.

Another object of the present disclosure is to provide an arrangement that maximizes heat transfer between a power supply unit and a housing.

Yet another object of the present disclosure is to provide an arrangement that improves the life of a power supply unit.

Other objects and advantages of the present disclosure will be more apparent from the following description, which is not intended to limit the scope of the present disclosure.

SUMMARY

The present disclosure envisages an arrangement for dissipating heat of a power supply unit in a housing. The arrangement comprises at least one packing member. The packing member is slid between the power supply unit and an operative inner wall of the housing. The arrangement is configured to increase conductive thermal contact between at least some of the inner walls of the housing and the power supply unit.

In an embodiment, the packing member is thermally conductive.

In another embodiment, the packing member is a slab of constant cross-section.

In yet another embodiment, the packing member is a wedge.

BRIEF DESCRIPTION OF THE ACCOMPANYING DRAWING

An arrangement for dissipating heat of a power supply unit in a housing, of the present disclosure, will now be described with the help of the accompanying drawing, in which.

LIST OF REFERENCE NUMERALS

Figure 1:
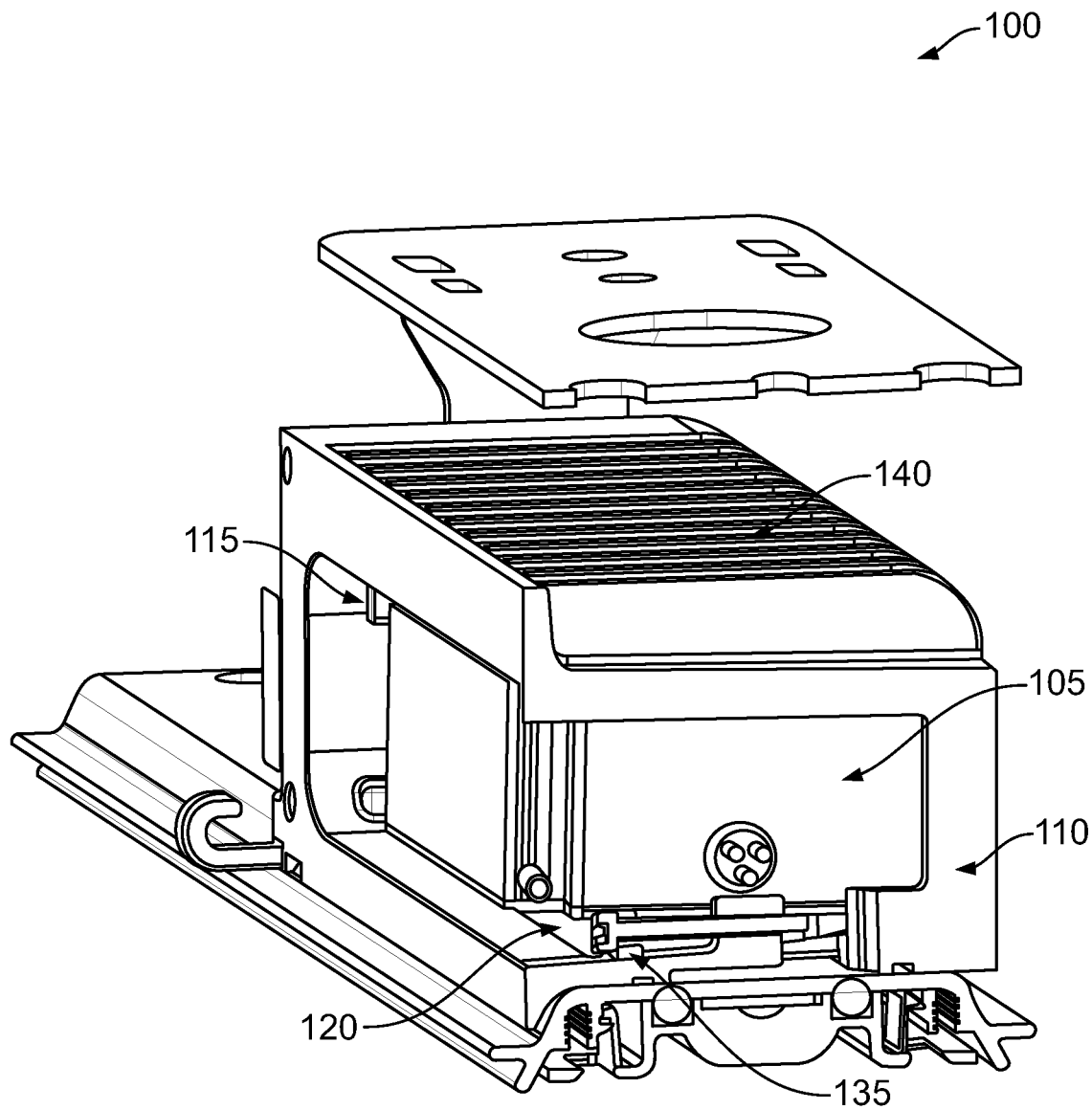
FIG. 1 illustrates an isometric view of an arrangement, in accordance with an embodiment of the present disclosure.
Figure 2:
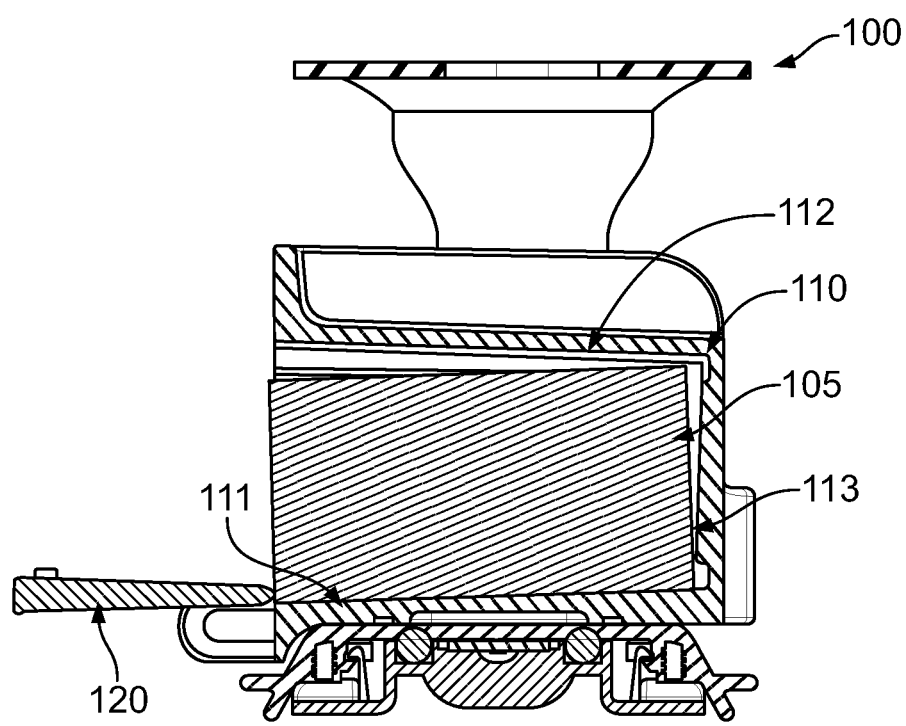
FIG. 2 illustrates a side view of a housing and a wedge.
Figure 3:
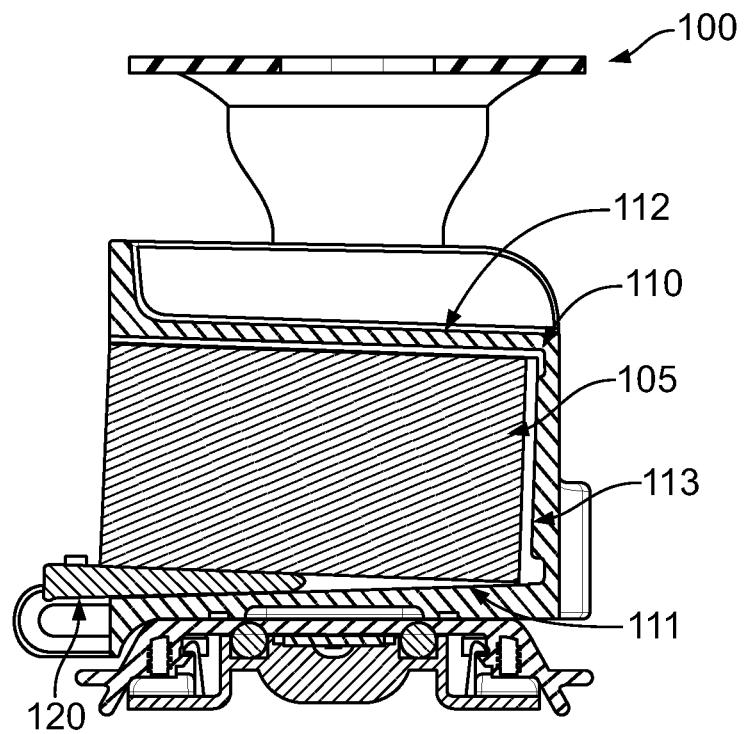
FIG. 3 illustrates a side view of the wedge partially inserted in the housing.
Figure 4:
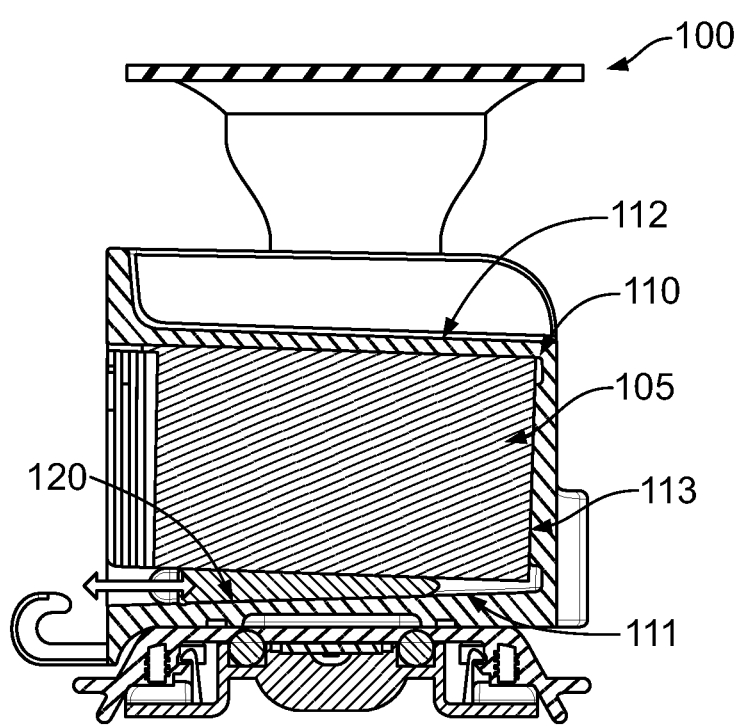
FIG. 4 illustrates a side view of the wedge fully inserted in the housing.

100—Arrangement
105—Power supply unit
110—Housing
111, 112, 113—Walls
115—Guiding channels
120—Packing member/Wedge
125—Cavity
130—Chamfered edges
135—Screw lugs
140—Fins

DETAILED DESCRIPTION

Embodiments, of the present disclosure, will now be described with reference to the accompanying drawing.

Embodiments are provided so as to thoroughly and fully convey the scope of the present disclosure to the person skilled in the art. Numerous details are set forth, relating to specific components, and methods, to provide a complete understanding of embodiments of the present disclosure. It will be apparent to the person skilled in the art that the details provided in the embodiments should not be construed to limit the scope of the present disclosure. In some embodiments, well-known processes, well-known apparatus structures, and well-known techniques are not described in detail.

The terminology used, in the present disclosure, is only for the purpose of explaining a particular embodiment and such terminology shall not be considered to limit the scope of the present disclosure. As used in the present disclosure, the forms "a", "an", and "the" may be intended to include the plural forms as well, unless the context clearly suggests otherwise. The terms "comprises", "comprising", "including", and "having" are open ended transitional phrases and therefore specify the presence of stated features, integers, steps, operations, elements, modules, units and/or components, but do not forbid the presence or addition of one or more other features, integers, steps, operations, elements, components, and/or groups thereof. The particular order of steps disclosed in the method and process of the present disclosure is not to be construed as necessarily requiring their performance as described or illustrated. It is also to be understood that additional or alternative steps may be employed.

When an element is referred to as being "mounted on", "engaged to", "connected to", or "coupled to" another element, it may be directly on, engaged, connected or coupled to the other element. As used herein, the term "and/or" includes any and all combinations of one or more of the associated listed elements.

The terms first, second, third, etc., should not be construed to limit the scope of the present disclosure as the aforementioned terms may be only used to distinguish one element, component, region, layer or section from another component, region, layer or section. Terms such as first, second, third etc., when used herein do not imply a specific sequence or order unless clearly suggested by the present disclosure.

Terms such as "inner", "outer", "beneath", "below", "lower", "above", "upper", and the like, may be used in the present disclosure to describe relationships between different elements as depicted from the figures.

An arrangement of the present disclosure is now described with reference to FIG. 1 through FIG. 7.

An arrangement 100, in accordance with an embodiment of the present disclosure, is shown in FIG. 1 to FIG. 7.

The arrangement 100 is configured for dissipating heat of a power supply unit 105 in a housing 110 by increasing conductive thermal contact between inner walls 111, 112, 113 of the housing 110 and the power supply unit 105. The housing 110 can be any housing configured for receiving the power supply unit 105. In an embodiment, the housing 110 is a housing of a LED fixture. The power supply unit 105 is received in the housing 110 and is electrically coupled to the LEDs mounted in the LED fixture for powering them.

The arrangement 100 comprises at least one packing member 120. The packing member 120 is disposed between the power supply unit 105 and the housing 110. More specifically, the packing member 120 is slid in the space between an inner wall 111 of the housing 110 and the power supply unit 105 when the power supply unit 105 is received in the housing 110.

As the power supply units are manufactured by different manufacturers, they vary in size and shape. Thus, when the power supply unit is received in the housing, the power supply unit does not abut inner walls of the housing, and a gap is maintained between the walls of the housing and respective side of the power supply unit. Further, the inner walls of the housing may not have a perfectly planar surface which further reduces the points of surface contact. This results in inefficient heat transfer between the power supply unit and the housing and increase in temperature of the power supply unit, and thereby, reduction in the life of the power supply unit. The packing member 120 is configured such that when it is inserted between an inner wall of the housing 110 and the power supply unit 105, the power supply unit 105 completely abuts at least two inner walls 112, 113 of the housing 110 and there is strong physical contact between the inner walls 112, 113 of the housing 110 and the power supply unit 105. Further, the dimensions of the packing member 120 are such that the packing member 120 abuts both the power supply unit 105 and the respective wall of the housing 110. Thus, when the packing member 120 is inserted in the housing 110, a conductive thermal contact is established between the power supply unit 105 and two orthogonal walls of the housing 110.

In an embodiment, the packing member 120 is thermally conductive. Thus, when the packing member 120 is inserted in the housing 110, heat transfer takes place between the power supply unit 105 and one wall 111 of the housing 110 via the packing member 120 which was not possible before inserting the thermally conductive packing member 120.

Thus, the power supply unit 105 is in direct physical contact with two orthogonal inner walls 112, 113 of the housing 110, and in contact with another inner wall 111 of the housing 110 via the packing member 120. Thus, maximum heat transfer takes place between the housing 110 and the power supply unit 105. This results in decrease in temperature of the power supply unit during its operation, and thereby, improves the life of the power supply unit.

In an embodiment, the packing member is a slab of constant cross-section. In this embodiment, the two orthogonal inner walls of the housing 110 are flat, more specifically, non-tapered. When the slab is inserted between an inner wall of the housing 110 and the power supply unit 105, the power supply unit 105 is in complete physical contact with two orthogonal walls of the housing 110 and the slab. If the slab is thermally conductive, it facilitates heat transfer between the power supply unit 105 and the inner wall of the housing 110 to which the slab abuts.

Figure 5:
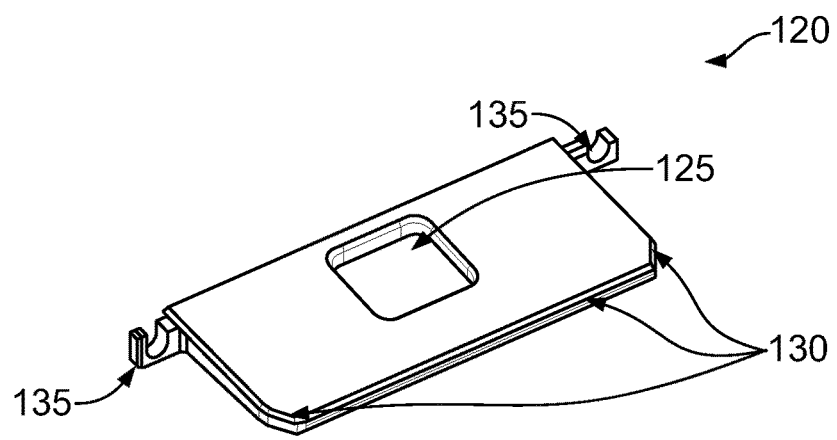
FIG. 5 illustrates an isometric view of the wedge of the arrangement, in accordance with an embodiment of the present disclosure.
Figure 6:
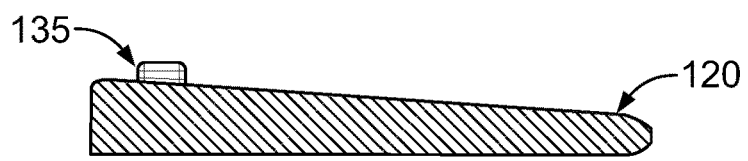
FIG. 6 illustrates a side view of the wedge.
Figure 7:
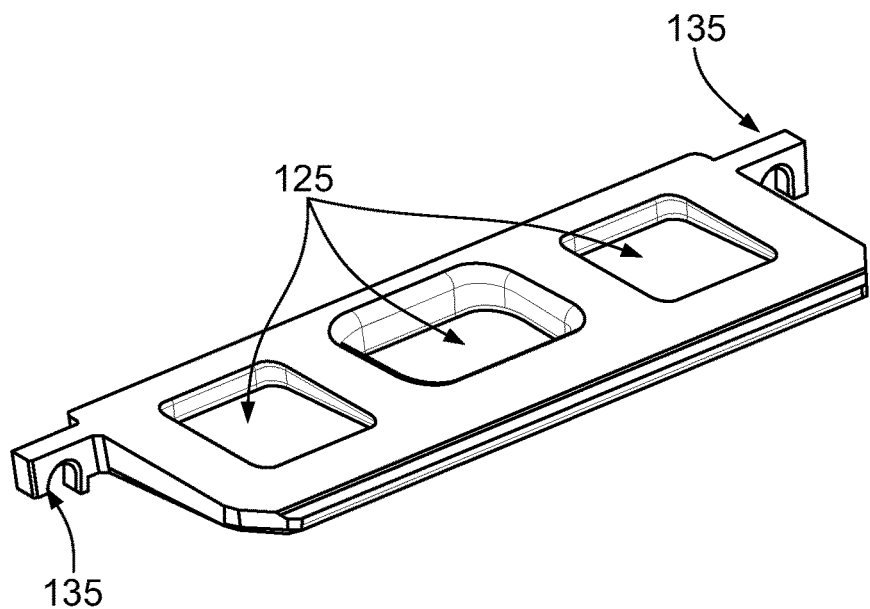
FIG. 7 illustrates an isometric view of the wedge of the arrangement, in accordance with another embodiment of the present disclosure.

In another embodiment, the packing member 120 is a wedge 120 as shown in FIG. 5 to FIG. 7.

At least one cavity 125 is configured on the wedge 120 to facilitate testing/reading specification of the power supply unit 105. In an embodiment, a plurality of cavities 125 is configured on the wedge 120 as shown in FIG. 7.

The wedge 120 has a tapered angle determined as per the application requirement. More specifically, the tapered angle is determined taking into account all alterations in the dimensions and size of the power supply unit 105 so that the wedge 120 can be used for varying sizes and shapes of the power supply unit 105. In an embodiment, the tapered angle of the wedge 120 ranges from 1° to 10°.

The wedge 120 has chamfered edges 130. The chamfered edges 130 facilitate easy insertion of the wedge 120 into the housing 110.

Screw lugs 135 are configured on the opposite sides of the wedge 120. The screw lugs 135 facilitate fastening of the wedge 120 to the housing 110. More specifically, the screw lugs 135 receive fasteners that fasten the wedge 120 to the housing 110. The fastening of the wedge 120 prevents dislocation of the wedge 120 or the power supply unit 105 when they are subjected to vibrations.

The arrangement 100 further comprises at least one first tapered inner wall 112 configured in the housing 110 to which the power supply unit 105 abuts. The first tapered inner wall 112 is configured opposite to a second inner wall 111 abutting the packing member 120. In an embodiment, the tapered angle of the first wall 112 is equal to the tapered angle of the wedge 120. Further, the third inner wall 113 orthogonal to the first tapered inner wall 112 is tapered. The arrangement 100 is configured to increase conductive thermal contact between the power supply unit and the first, second and third tapered walls.

The arrangement 100 comprises a pair of guiding channels 115. The guiding channels 115 are configured on one operative inner wall of the housing 110. The guiding channels 115 are configured to guide the power supply unit 105 while inserting it in the housing 110. The guiding channels 115 ensure correct orientation of the power supply unit 105 in the housing 110. The guiding channels 115 are arranged in a spaced apart configuration in the housing 110. The distance between the guiding channels 115 is slightly more than the width/length of the power supply unit 105 as per the orientation requirement.

In an embodiment, the guiding channels 115 are formed integral with the inner wall of the housing 110.

The arrangement 100 further includes a plurality of fins 140 configured on an operative outer surface of the housing 110. The heat transferred by the power supply unit 105 to the walls of the housing 110 is dissipated to atmosphere by the fins 140. In an embodiment, the fins 140 are configured on an operative outer surface of the first wall 112 of the housing 110.

The present disclosure further envisages a method of dissipating heat of a power supply unit in a housing. The method is now described with reference to FIG. 1 to FIG. 4.

Initially, the power supply unit 105 is slid along the guiding channels 115 in the housing 110. Further, the packing member 120 is inserted between an inner wall 111 of the housing 110 and the power supply unit 105 to increase surface contact between the housing 110 and the power supply unit 105. After fully inserting the packing member 120, the power supply unit 105 fully abuts the two orthogonal walls of the housing 110, and the packing member 120 is sandwiched between another wall of the housing 110 and the power supply unit 105.

Once the packing member 120 is fully inserted between the inner wall of the housing 110 and the power supply unit 105, the packing member 120 is secured to the housing 110 using fasteners that pass through the screw lugs 135.

The arrangement of the present disclosure was tested against the conventional arrangement in which the power supply unit was mounted in the housing using fasteners. The results of the tested are provided below.

| Test 1 | | |
|---|---|---|
|  | Conventional arrangement | Arrangement of the present disclosure |
| Surrounding temperature during testing | 25° C. | |
| Temperature rise of power supply above surrounding temperature measured at critical point | 24.75 | 20.27 |
| Percentage Improvement | 18.1 | |

| Test 2 | | |
|---|---|---|
|  | Conventional arrangement | Arrangement of the present disclosure |
| Surrounding temperature during testing | 40° C. | |
| Temperature rise of power supply above surrounding temperature measured at critical point | 21 | 20 |
| Percentage Improvement | 4.76 | |

| Test 3 | | |
|---|---|---|
|  | Conventional arrangement | Arrangement of the present disclosure |
| Surrounding temperature during testing | 65° C. | |
| Temperature rise of power supply above surrounding temperature measured at critical point | 19.53 | 18.68 |
| Percentage Improvement | 4.35 | |

From the above results, it is clearly evident that the temperature of a power supply unit (during its operation) rises less when the arrangement 100 of the present disclosure is used as against the conventional arrangement.

The foregoing description of the embodiments has been provided for purposes of illustration and not intended to limit the scope of the present disclosure. Individual components of a particular embodiment are generally not limited to that particular embodiment, but, are interchangeable. Such variations are not to be regarded as a departure from the present disclosure, and all such modifications are considered to be within the scope of the present disclosure.

TECHNICAL ADVANCEMENTS

The present disclosure described herein above has several technical advantages including, but not limited to, the realization of an arrangement that:

maximizes surface contact between a power supply unit and inner walls of a housing;

maximizes heat transfer between a power supply unit and a housing; and improves the life of a power supply unit.

The embodiments herein and the various features and advantageous details thereof are explained with reference to the non-limiting embodiments in the following description. Descriptions of well-known components and processing techniques are omitted so as to not unnecessarily obscure the embodiments herein. The examples used herein are intended merely to facilitate an understanding of ways in which the embodiments herein may be practiced and to further enable those of skill in the art to practice the embodiments herein. Accordingly, the examples should not be construed as limiting the scope of the embodiments herein.

The foregoing description of the specific embodiments so fully reveal the general nature of the embodiments herein that others can, by applying current knowledge, readily modify and/or adapt for various applications such specific embodiments without departing from the generic concept, and, therefore, such adaptations and modifications should and are intended to be comprehended within the meaning and range of equivalents of the disclosed embodiments. It is to be understood that the phraseology or terminology employed herein is for the purpose of description and not of limitation. Therefore, while the embodiments herein have been described in terms of preferred embodiments, those skilled in the art will recognize that the embodiments herein can be practiced with modification within the spirit and scope of the embodiments as described herein.

The use of the expression "at least" or "at least one" suggests the use of one or more elements or ingredients or quantities, as the use may be in the embodiment of the disclosure to achieve one or more of the desired objects or results.

Any discussion of documents, acts, materials, devices, articles or the like that has been included in this specification is solely for the purpose of providing a context for the disclosure. It is not to be taken as an admission that any or all of these matters form a part of the prior art base or were common general knowledge in the field relevant to the disclosure as it existed anywhere before the priority date of this application.

The numerical values mentioned for the various physical parameters, dimensions or quantities are only approximations and it is envisaged that the values higher/lower than the numerical values assigned to the parameters, dimensions or quantities fall within the scope of the disclosure, unless there is a statement in the specification specific to the contrary.

While considerable emphasis has been placed herein on the components and component parts of the preferred embodiments, it will be appreciated that many embodiments can be made and that many changes can be made in the preferred embodiments without departing from the principles of the disclosure. These and other changes in the preferred embodiment as well as other embodiments of the disclosure will be apparent to those skilled in the art from the disclosure herein, whereby it is to be distinctly understood that the foregoing descriptive matter is to be interpreted merely as illustrative of the disclosure and not as a limitation.

What is claimed is:

1. An arrangement for dissipating heat of a power supply unit in a housing, said arrangement comprising at least one packing member slid between said power supply unit and an inner wall of said housing, said arrangement configured to increase conductive thermal contact between the inner walls of said housing and said power supply unit;
    wherein said packing member is a wedge;
    wherein said arrangement comprises a first tapered inner wall and a second tapered inner wall configured in said housing, said first tapered inner wall is configured opposite to said second tapered inner wall abutting said packing member; and
    wherein said arrangement comprises a third tapered inner wall configured in said housing, said third tapered inner wall is orthogonal to said first tapered inner wall and said second inner wall, and said arrangement is configured to increase conductive thermal contact between said power supply unit and said first, second and third tapered walls.

2. The arrangement as claimed in claim 1, wherein said packing member is thermally conductive.

3. The arrangement as claimed in claim 1, wherein said packing member is a slab of constant cross-section.

4. The arrangement as claimed in claim 1, wherein said arrangement includes at least one cavity configured on said wedge.

5. The arrangement as claimed in claim 1, wherein the tapered angle of said wedge ranges from 1° to 10°.

6. An arrangement for dissipating heat of a power supply unit in a housing, said arrangement comprising at least one packing member slid between said power supply unit and an operative inner wall of said housing, said arrangement configured to increase conductive thermal contact between at least some of the inner walls of said housing and said power supply unit;
    wherein said packing member is a wedge; and
    wherein said wedge has chamfered edges.

7. The arrangement as claimed in claim 1, wherein said wedge comprises screw lugs provided on opposite sides thereof to fasten said wedge to said housing.

8. An arrangement for dissipating heat of a power supply unit in a housing, said arrangement comprising at least one packing member slid between said power supply unit and an inner wall of said housing, said arrangement configured to increase conductive thermal contact between at least some of the inner walls of said housing and said power supply unit;
    wherein said packing member is a wedge;
    wherein said arrangement comprises a first tapered inner wall and a second tapered inner wall configured in said housing, said first tapered inner wall is configured opposite to said second tapered inner wall abutting said packing member; and
    wherein a tapered angle of said first tapered inner wall is equal to a tapered angle of said wedge.

9. The arrangement as claimed in claim 1, wherein said arrangement includes a pair of guiding channels configured on the inner wall of said housing to guide said power supply unit in said housing.

10. The arrangement as claimed in claim 1, wherein said arrangement includes a plurality of fins configured on an outer surface of said housing.

11. A method of dissipating heat of a power supply unit in a housing, said method comprising the step of inserting a packing member between an inner wall of said housing and said power supply unit to increase conductive thermal contact between the inner wall of said housing and said power supply unit;
    wherein said packing member is a wedge;
    wherein said arrangement comprises a first tapered inner wall and a second tapered inner wall configured in said housing, said first tapered inner wall is configured opposite to said second tapered inner wall abutting said packing member; and
    wherein said arrangement comprises a third tapered inner wall configured in said housing, said third tapered inner wall is orthogonal to said first tapered inner wall and said second inner wall, and said arrangement is configured to increase conductive thermal contact between said power supply unit and said first, second and third tapered walls.

12. The method as claimed in claim 11, wherein said method comprises the step of securing said packing member within said housing via fasteners.

\* \* \* \* \*